(12) United States Patent
Schmitt et al.

(10) Patent No.: US 9,136,217 B2
(45) Date of Patent: Sep. 15, 2015

(54) ONE-TIME PROGRAMMABLE MEMORY CELL

(75) Inventors: Jonathan Schmitt, Eden Praire, MN (US); Roy Milton Carlson, Plymouth, MN (US); Yong Lu, Edina, MN (US); Owen Hynes, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 316 days.

(21) Appl. No.: 13/608,595

(22) Filed: Sep. 10, 2012

(65) Prior Publication Data

US 2014/0071731 A1    Mar. 13, 2014

(51) Int. Cl.
| | |
|---|---|
| *G11C 17/00* | (2006.01) |
| *H01L 23/525* | (2006.01) |
| *H01L 27/06* | (2006.01) |
| *H01L 27/10* | (2006.01) |

(52) U.S. Cl.
CPC ........ *H01L 23/5252* (2013.01); *H01L 27/0629* (2013.01); *H01L 27/101* (2013.01); *H01L 2924/0002* (2013.01)

(58) Field of Classification Search
CPC .......... G11C 5/02; G11C 17/00; G11C 17/18; H01L 23/5252; H01L 27/0629; H01L 27/101; H01L 2924/0002
USPC ........... 365/56, 96, 225.7, 104; 257/296, 298, 257/302, 314, 321, 328
See application file for complete search history.

(56) References Cited

U.S. PATENT DOCUMENTS

| | | | |
|---|---|---|---|
| 7,206,247 B2 * | 4/2007 | Jenne | 365/225.7 |
| 8,031,506 B2 * | 10/2011 | Schmitt et al. | 365/96 |
| 2005/0007855 A1 | 1/2005 | Lee et al. | |
| 2005/0029622 A1 | 2/2005 | Marr et al. | |
| 2012/0211841 A1 * | 8/2012 | Kurjanowicz | 257/369 |

OTHER PUBLICATIONS

Office Action directed to related Taiwanese Patent Application No. 102130785, mailed Mar. 23, 2015; 6 pages.
Kim et al., "Three-Transistor One-Time Programmable (OTP) ROM Cell Array Using Standard CMOS Gate Oxide Antifuse," IEEE Electron Device Letters, vol. 24, No. 9, Sep. 2003.

* cited by examiner

*Primary Examiner* — Thao H Bui
(74) *Attorney, Agent, or Firm* — Sterne, Kessler, Goldstein & Fox P.L.L.C.

(57) ABSTRACT

A programmable memory cell including a thick oxide spacer transistor, a programmable thin oxide anti-fuse disposed adjacent to the thick oxide spacer transistor, and first and second thick oxide access transistors. The thick oxide spacer transistor and first and second thick oxide access transistors can include an oxide layer that is thicker than an oxide layer of the programmable thin oxide anti-fuse. The programmable thin oxide anti-fuse and the thick oxide spacer transistor can be natively doped. The first and second thick oxide access transistors can be doped so as to have standard threshold voltage characteristics.

20 Claims, 7 Drawing Sheets

Related Art

ONE-TIME PROGRAMMABLE MEMORY CELL

FIELD

This application relates generally to memory devices, and more particularly to one-time programmable (OTP) memory cells.

BACKGROUND

The field of data storage includes both volatile memory and non-volatile memory. Volatile memory loses stored information when power is removed from the volatile memory circuit. Non-volatile memory retains stored information even after power is removed. Some non-volatile memory designs permit reprogramming while other designs only permit one-time programming.

One time programmable (OTP) memory represents a type of non-volatile memory that may be programmed only once, typically, by opening a fuse to create a high impedance connection or by permanently closing an anti-fuse to create a low-impedance connection. An anti-fuse can be programmed by applying a high voltage to rupture the anti-fuse and create the low impedance connection.

OTP memory cells utilizing an anti-fuse may exhibit an unpredictable and wide range of IV (current-voltage) characteristics following programing because the anti-fuse rupture site location may vary from device to device. Consequently, there is a need for an OTP memory cell that exhibits improved predictability and improved IV characteristics.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, of the embodiments described herein may be practiced without one or more of these specific details.

The present disclosure is directed to one-time programmable (OTP) memory, and more particularly to an OTP memory cell including an anti-fuse and one or more access transistors. In an unprogrammed state, the anti-fuse is an open circuit that prevents current from passing through the anti-fuse and access transistor. When programmed, the anti-fuse of the memory cell is ruptured, thereby forming a conductive path through the rupture site in the anti-fuse and the one or more access transistors.

Figure 1:
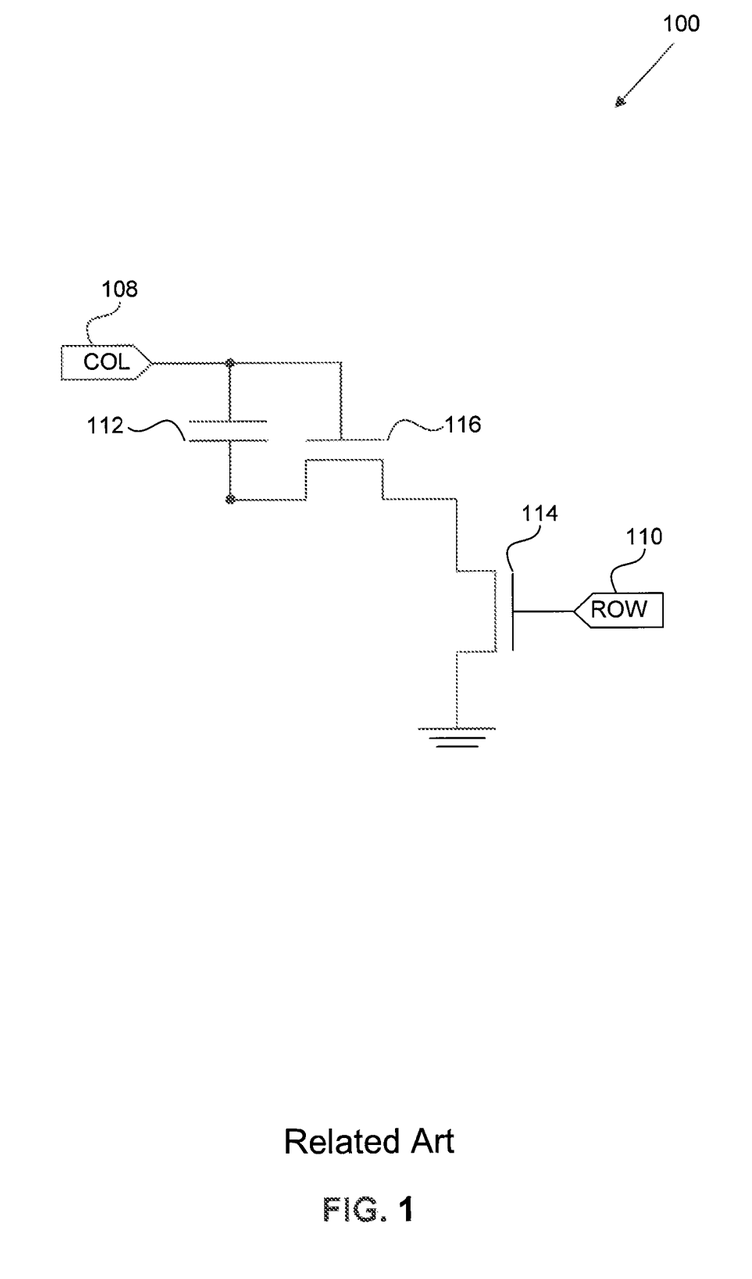
FIG. 1 illustrates a conventional OTP memory cell circuit.

FIG. 1 illustrates a conventional circuit of a one-time programmable (OTP) memory cell 100. The memory cell 100 can include column line 108, programmable thin oxide anti-fuse 112, thick oxide spacer transistor 116, thick oxide access transistor 114, and row line 110. Memory cell 100 stores one bit of information based on the state of anti-fuse 112. The state of the memory cell 100 is based on whether anti-fuse 112 is "programmed" (e.g., the anti-fuse 112 has been ruptured) or "unprogrammed" (e.g., the anti-fuse 112 has not been ruptured and maintains an open circuit). The memory cell 100 is fabricated in the unprogrammed state and may be programmed only once. That is, once programmed, memory cell 100 cannot revert to the unprogrammed state.

Memory cell 100 can be programmed by applying a programming voltage to anti-fuse 112 and the gate of the spacer transistor 116 through column line 108, and a supply voltage to the gate of access transistor 114 through row line 110. The supply voltage on the gate of access transistor 114 reduces the source to drain impedance of access transistor 114, thereby coupling anti-fuse 112 to ground through access transistor 114.

The programming voltage is a voltage having a magnitude sufficiently large enough to rupture the anti-fuse 112 when the column line is pulled to ground, and can be, for example, a voltage greater than 5V. For purposes of this discussion, the programming voltage can be, for example, approximately 5.4V. The supply voltage applied to the gate of the access transistor 114 can be, for example, approximately 1.8V. The applied voltages should not be limited hereto, and may be any voltages that will be apparent to those skilled in the relevant art(s) without departing from the spirit and scope of the present disclosure that would result in the programming of the memory cell 100 without causing damage to the memory cell 100 and/or to any neighboring memory cell. That is, the programming voltage must be of sufficient magnitude to rupture the anti-fuse 112 when applied through column line 108, but not of a magnitude that would result in the rupturing of anti-fuses of adjacent memory cells. Similarly, a reading voltage must not have a magnitude large enough to rupture anti-fuses of adjacent memory cells when applied through column line 108 during a read operation.

The programming voltage on the gate of spacer transistor 116 reduces the impedance between the drain of access transistor 114 and anti-fuse 112. The supply voltage is a voltage that is placed on the gate of access transistor 114, which reduces the source-to-drain impedance of access transistor 114. As a result, the anti-fuse 112 is coupled to ground through spacer and access transistors 116 and 114, respectively. The resulting voltage potential across anti-fuse 112 is sufficient to rupture anti-fuse 112, thereby placing anti-fuse 112 in a low impedance state (e.g., the programmed state).

Memory cell 100 can be read by applying a reading voltage to anti-fuse 112 and the gate of spacer transistor 116 through column line 108, and a supply voltage to the gate of access transistor 114 through row line 110. The supply voltage on the gate of access transistor 114 reduces the source-to-drain impedance of the access transistor 114. Similarly, the reading voltage on the gate of spacer transistor 116 reduces the impedance of spacer transistor 116. The programmed anti-fuse 112 is thereby coupled to ground across spacer and access transistors 116 and 114. The reading voltage can be, for example, approximately 1.1-1.4V. However, the reading voltage should not be limited hereto, and may be any voltage that will be apparent to those skilled in the relevant art(s) without departing from the spirit and scope of the present disclosure that would result in the reading of the memory cell 100 without causing damage to the memory cell 100 and/or to any neighboring memory cell, as well as without rupturing the anti-fuse 112.

If anti-fuse 112 is unprogrammed (e.g., anti-fuse 112 is an open circuit), and because the resulting reading voltage potential across anti-fuse 112 is insufficient to rupture the anti-fuse 112 in a read process, the column line 108 will remain at the reading voltage potential, thereby indicating the unprogrammed state. In contrast, if the anti-fuse 112 has been programmed, column line 108 will be pulled to ground through spacer transistor 116 and access transistor 114. Thus, the potential on column line 108 will decline sufficiently below the reading voltage to indicate a programmed state. In particular, the potential on column line 108 will decline to the switching threshold of spacer transistor 116, which in one exemplary embodiment can be approximately 0.7V.

Figure 2:
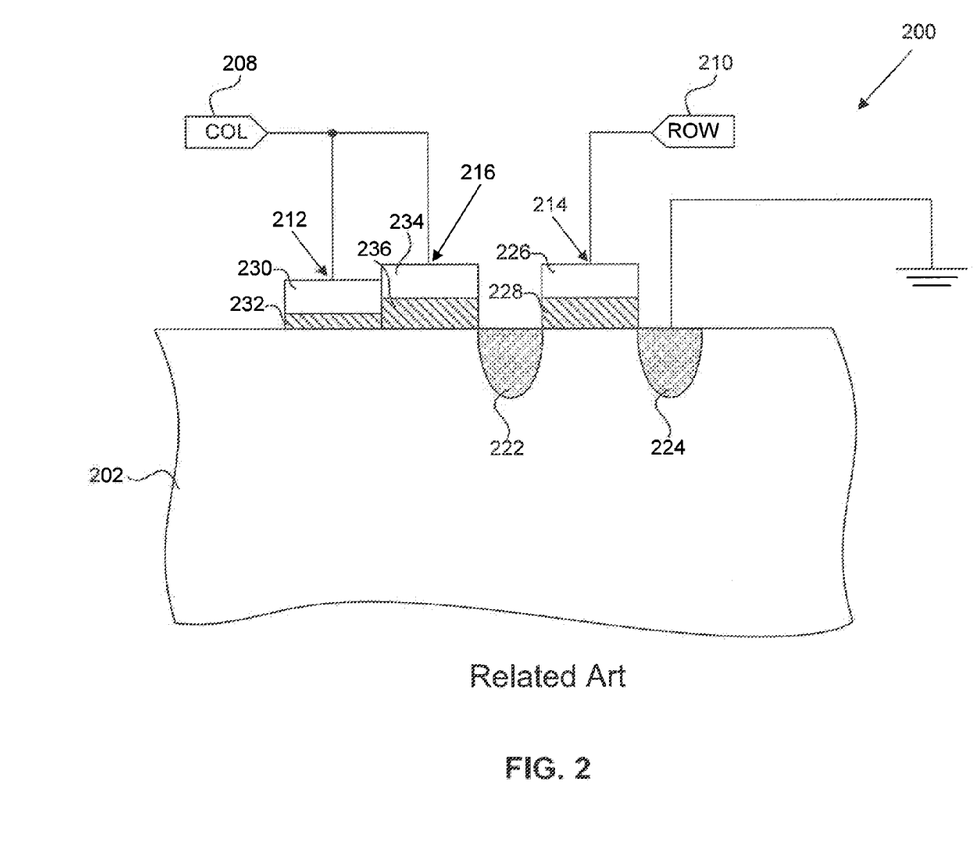
FIG. 2 illustrates a conventional OTP memory cell cross-section.

FIG. 2 illustrates a cross-sectional view of a conventional OTP memory cell 200, and that may be represented by the circuit of the OTP memory cell 100 shown in FIG. 1.

Memory cell 200 includes column line 208, programmable thin oxide anti-fuse 212, thick oxide spacer transistor 216, thick oxide access transistor 214, and row line 210. These elements correspond respectively to column line 108, programmable thin oxide anti-fuse 112, thick oxide spacer transistor 116, thick oxide access transistor 114, and row line 110 in memory cell 100 in FIG. 1. The programmable thin oxide anti-fuse 212, thick oxide spacer transistor 216, and thick oxide access transistor 214 can be formed on a substrate 202. The memory cell 200 can also include source and drain regions 224 and 222, which are diffusion regions formed within the substrate 202.

As illustrated in FIG. 2, anti-fuse 112 can abut (e.g., be generally proximate to) one side of the spacer transistor 216, while drain region 222 of access transistor 214 can abut an opposite side of the spacer transistor 116. Notably, drain region 222 can be the drain of access transistor 214 and can also be the source of spacer transistor 216.

In an exemplary embodiment of the present disclosure, anti-fuse 212 includes polysilicon layer 230 and thin oxide layer 232 on substrate 202. The thin oxide layer 232 can have a thickness of, for example, approximately 20 angstroms (Å).

In an exemplary embodiment of the present disclosure, spacer transistor 216 includes polysilicon gate 234, thick oxide layer 236, and drain region 222. The thick oxide layer 236 can have a thickness of, for example, approximately 40-70 Å. It is notable that thin oxide layer 232 is substantially thinner than thick oxide layer 236, and hence is designed rupture under the programming voltage (e.g., 5V), while oxide layer 236 stays intact. Further, gate 234 and thick oxide layers 236 are disposed on substrate 202, while drain region 222 is a diffusion region in substrate 202.

In an exemplary embodiment of the present disclosure, access transistor 214 includes polysilicon gate 226, thick oxide layer 228, source region 224, and drain region 222. The polysilicon gate 226 and thick oxide layers 228 are formed on substrate 202, while source and drain regions 224 and 222 are diffusion regions in substrate 202. Further, the thick oxide layer 228 can have a thickness of, for example, approximately 40-70 Å.

Although layer 230, gate 234, and gate 226 of the above exemplary embodiments are described as polysilicon, they are not limited to such material, as different materials can be used that will be apparent to those skilled in the relevant art(s) without departing from the spirit and scope of the present disclosure. In the above exemplary embodiments, the substrate 202 can comprise silicon. However, the composition of the substrate 202 is not limited to silicon and different substrate materials can be used that will be apparent to those skilled in the relevant art(s) without departing from the spirit and scope of the present disclosure.

Figure 3:
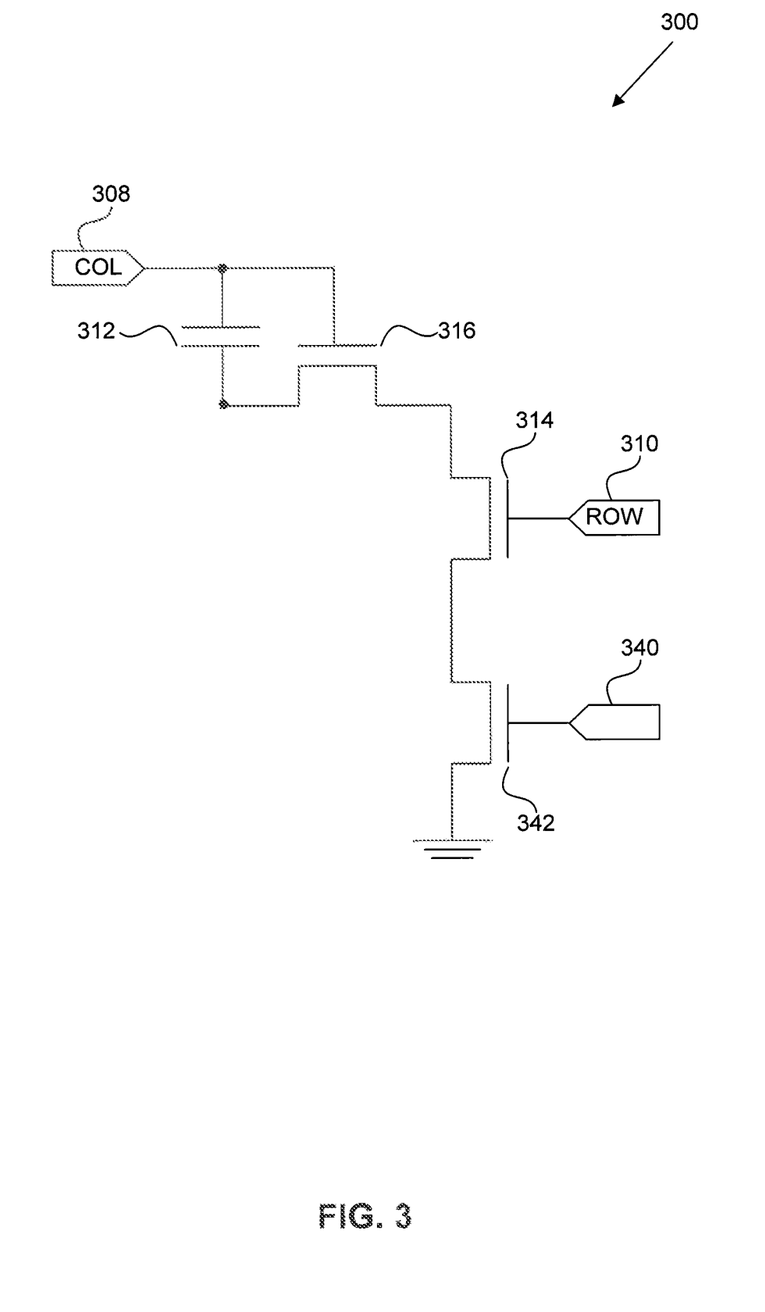
FIG. 3 illustrates an exemplary OTP memory cell circuit in accordance with an exemplary embodiment of the present disclosure.

FIG. 3 illustrates an exemplary circuit of a one-time programmable (OTP) memory cell 300 according to an exemplary embodiment of the present disclosure. The memory cell 300 is similar to the memory cell 100 shown in FIG. 1, and includes a second thick oxide access transistor 342. The second thick oxide access transistor 342 provides the benefit of additional voltage protection for the memory cell 300.

Memory cell 300 can include column line 308, programmable thin oxide anti-fuse 312, thick oxide spacer transistor 316, a first thick oxide access transistor 314, a second thick oxide access transistor 342, row line 310, and input 340. Memory cell 300 stores one bit of information based on the state of anti-fuse 312. The state of the memory cell 300 is based on whether anti-fuse 312 is "programmed" (e.g., the anti-fuse 312 has been ruptured) or "unprogrammed" (e.g., the anti-fuse 312 has not been ruptured and maintains an open circuit). The memory cell 300 is fabricated in the unprogrammed state and may be programmed only once. That is, once programmed, memory cell 300 cannot revert to the unprogrammed state.

Memory cell 300 can be programmed by applying a programming voltage to anti-fuse 312 and the gate of the spacer transistor 316 through column line 308, and a first supply voltage to the gate of the first thick oxide access transistor 314 through row line 310 and a second supply voltage to the gate of the second thick oxide access transistor 342 through input 340. The programming voltage is a voltage having a magnitude sufficiently large enough to rupture the anti-fuse 312 when the column line 308 is pulled to ground, and may be, for example, a voltage greater than 5V. For purposes of this discussion, the programming voltage can be, for example, approximately 5.4V. The first supply voltage applied to the gate of the first thick oxide access transistor 314 can be, for example, approximately 3.6V. The second supply voltage applied to the gate of the second thick oxide access transistor 342 can be, for example, approximately 1.8V. The applied voltages should not be limited hereto, and may be any voltages that will be apparent to those skilled in the relevant art(s) without departing from the spirit and scope of the present disclosure that would result in the programming of the memory cell 300 without causing damage to the memory cell 300 and/or to any neighboring memory cell. That is, the programming voltage must be of sufficient magnitude to rupture the anti-fuse 312 when applied through column line 308, but not of a magnitude that would result in the rupturing of anti-fuses of adjacent memory cells. Similarly, a reading voltage must not have a magnitude large enough to rupture anti-fuses of adjacent memory cells when applied through column line 308 during a read operation.

The programming voltage on the gate of spacer transistor 316 substantially turns the transistor "on" and thereby reduces the impedance between the drain of access transistor 314 and anti-fuse 312. The supply voltages placed on gates of the first and second thick oxide access transistors 314 and 342 substantially turns the transistors "on" and thereby reduces the source-to-drain impedance of the first and second thick oxide access transistors 314 and 342. As a result, the anti-fuse 312 is coupled to ground through spacer transistor 316, and through first and second thick oxide access transistors 314 and 342. The resulting voltage potential across anti-fuse 312 is sufficient to rupture anti-fuse 312, thereby placing anti-fuse 312 in a low impedance state (e.g., the programmed state).

Memory cell 300 can be read by applying a reading voltage of, for example, approximately 1.1V to 1.4V to anti-fuse 312, and the second supply voltage (e.g., 1.8V) to the gates of the first and second thick oxide access transistors 314 and 342 through row line 310 and input 340, respectively. The supply voltage on the gates of the first and second thick oxide access transistors 314 and 342 substantially turns the transistors "on" and thereby reduces the source-to-drain impedance of the access transistors 314 and 342, respectively. Similarly, the reading voltage on the gate of spacer transistor 316 reduces the impedance of spacer transistor 316. The programmed anti-fuse 312 is thereby coupled to ground across spacer transistor 316 and access transistors 314 and 342.

If anti-fuse 312 is unprogrammed (e.g., anti-fuse 312 is an open circuit), and because the resulting reading voltage potential across anti-fuse 312 is insufficient to rupture the anti-fuse 312 in a read process, the column line 308 will remain at the applied voltage potential (e.g., 1.1V to 1.4V), thereby indicating the unprogrammed state. In contrast, if the anti-fuse 312 has been programmed, column line 308 will be pulled to ground through spacer transistor 316 and access transistors 314 and 342. Thus, the potential on column line 308 will decline sufficiently below the applied reading voltage to indicate a programmed state. In particular, the potential on column line 308 will decline to the switching threshold voltage of spacer transistor 316, which in one exemplary embodiment can be approximately 0.7V.

Figure 4:
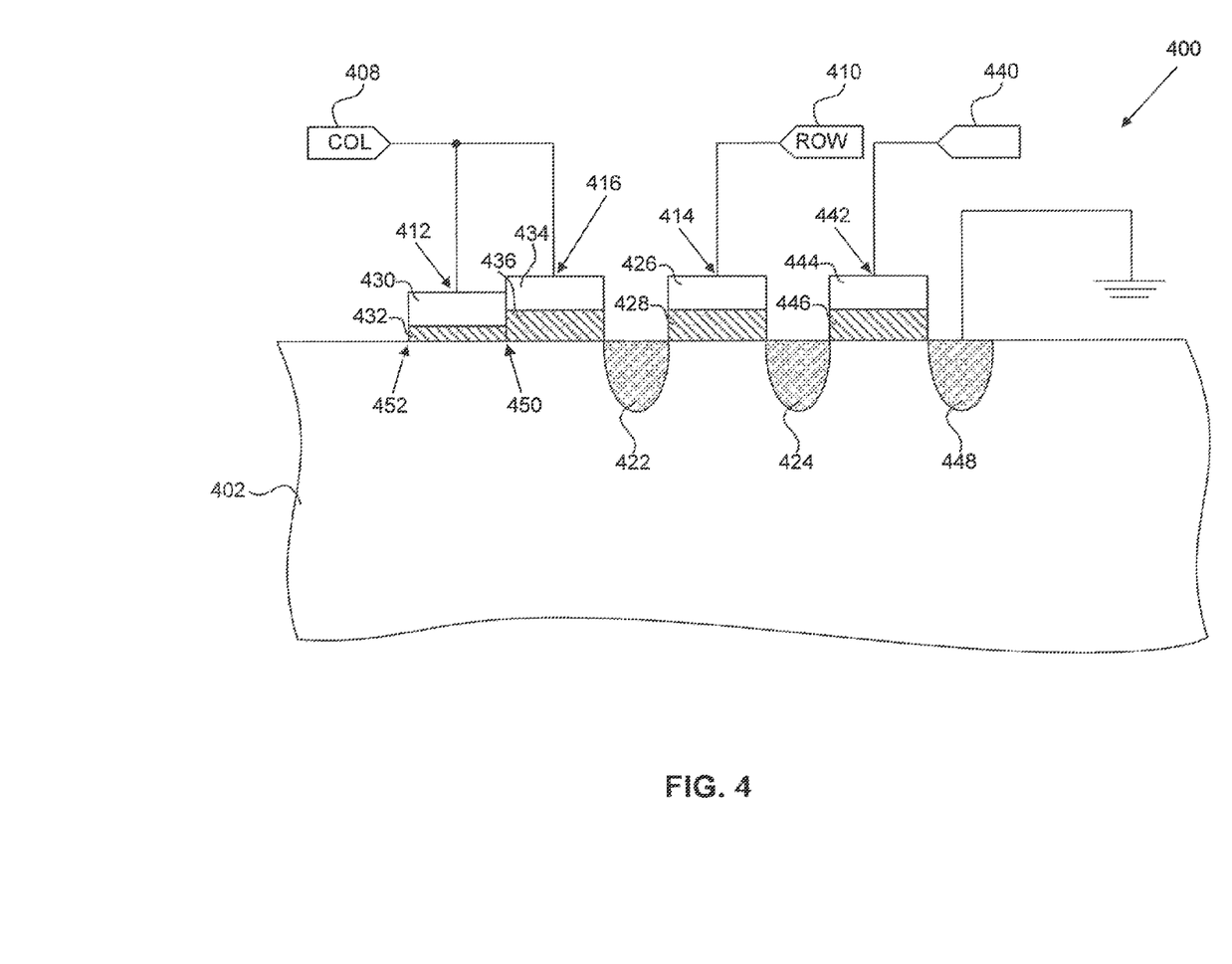
FIG. 4 illustrates an exemplary OTP memory cell cross-section in accordance with an exemplary embodiment of the present disclosure.

FIG. 4 illustrates a cross-sectional view of an exemplary OTP memory cell 400 in an exemplary embodiment of the present disclosure, and that may be represented by the exemplary circuit of the OTP memory cell 300 shown in FIG. 3.

Memory cell 400 can include column line 408, programmable thin oxide anti-fuse 412, thick oxide spacer transistor 416, a first thick oxide access transistor 414, a second thick oxide access transistor 442, row line 410, and input 440. Memory cell 400 stores one bit of information based on the state of anti-fuse 412. These elements correspond respectively to column line 308, programmable thin oxide anti-fuse 312, thick oxide spacer transistor 316, first thick oxide access transistor 314, second thick oxide access transistor 342, row line 310, and input 340 of memory cell 300 in FIG. 3. The programmable thin oxide anti-fuse 412, thick oxide spacer transistor 416, and first and second thick oxide access transistors 414 and 442 can be formed on a substrate 402. The memory cell 400 can also include source/drain regions 422, 424, and 448, which are diffusion regions formed within the substrate 202.

As illustrated in FIG. 4, anti-fuse 412 can abut (e.g., be generally proximate to) one side of the spacer transistor 416, while drain region 422 of the first thick oxide access transistor 414 can abut an opposite side of the spacer transistor 416. Notably, drain region 422 can function as the drain of access transistor 414 and can also function as the source of spacer transistor 416. The first thick oxide access transistor 414 can abut an opposite of the drain region 422 with respect to the spacer transistor 416, while source region 424 of the first thick oxide access transistor 414 can abut an opposite side of the thick oxide access transistor 414. Notably, source region 424 can function as the source of the first thick oxide access transistor 414 and can also function as the drain of the second thick oxide access transistor 442. Source region 448 of the second thick oxide access transistor 442 can abut an opposite side of the thick oxide access transistor 442 with respect to the drain region 424 of the thick oxide access transistor 442.

In an exemplary embodiment of the present disclosure, anti-fuse 412 includes polysilicon layer 430 and thin oxide layer 432 formed on substrate 402. The thin oxide layer 432 can have a thickness of, for example, approximately 20 angstroms (Å).

In an exemplary embodiment of the present disclosure, spacer transistor 416 includes polysilicon gate 434, thick oxide layer 436, and drain region 422. The thick oxide layer 436 can have a thickness of, for example, approximately 40-70 Å. Further, polysilicon gate 434 and thick oxide layers 436 are formed on substrate 402, while source region 422 is a diffusion region in substrate 402.

In an exemplary embodiment of the present disclosure, the first thick oxide access transistor 414 includes polysilicon gate 426, thick oxide layer 428, source region 424, and drain region 422. The polysilicon gate 426 and thick oxide layers 428 are formed on substrate 402, while source and drain regions 424 and 422 are diffusion regions in substrate 402. Further, the thick oxide layer 428 can have a thickness of, for example, approximately 40-70 Å.

In an exemplary embodiment of the present disclosure, the second thick oxide access transistor 442 includes polysilicon gate 444, thick oxide layer 446, drain region 424, and source region 448. The polysilicon gate 444 and thick oxide layers 446 are formed on substrate 402, while drain and source 424 and 448 are diffusion regions in substrate 402. Further, the thick oxide layer 446 can have a thickness of, for example, approximately 40-70 Å.

Although layer 430, gate 434, gate 426 and gate 444 of the above exemplary embodiments comprise polysilicon, they are not limited to such material and different materials can be used that will be apparent to those skilled in the relevant art(s) without departing from the spirit and scope of the present disclosure. In the above exemplary embodiments, the substrate 402 can comprise silicon. However, the composition of the substrate 402 is not limited to silicon and different substrate materials can be used that will be apparent to those skilled in the relevant art(s) without departing from the spirit and scope of the present disclosure.

The IV (current-voltage) characteristics of programmed instances of memory cell 400 are beneficially made more uniform by the interposition of spacer transistor 416 between anti-fuse 412 and first thick oxide access transistor 414. Spacer transistor 416 ensures a minimum distance between a rupture site in thin oxide layer 432 and drain region 422. Whether a rupture site occurs on one side 450 of thin oxide layer 432 or on an opposite side 452 of thin oxide layer 432 with respect to the spacer transistor 416, the additional buffer distance to the drain region 422 imposed by the spacer transistor 416 significantly reduces the impact of the resulting location of the rupture site, and thus increases the uniformity of the IV characteristic of the programmed memory cell 400. Stated another way, the lateral distance of the spacer transistor 416 reduces the effect of the possible varying locations of the rupture site. Moreover, the addition of the second thick oxide access transistor 442 provides the benefit of increased voltage protection. This improvement in IV characteristics and voltage protection leads to increased programming certainty and lifetime of the memory cell 400.

Figure 5:
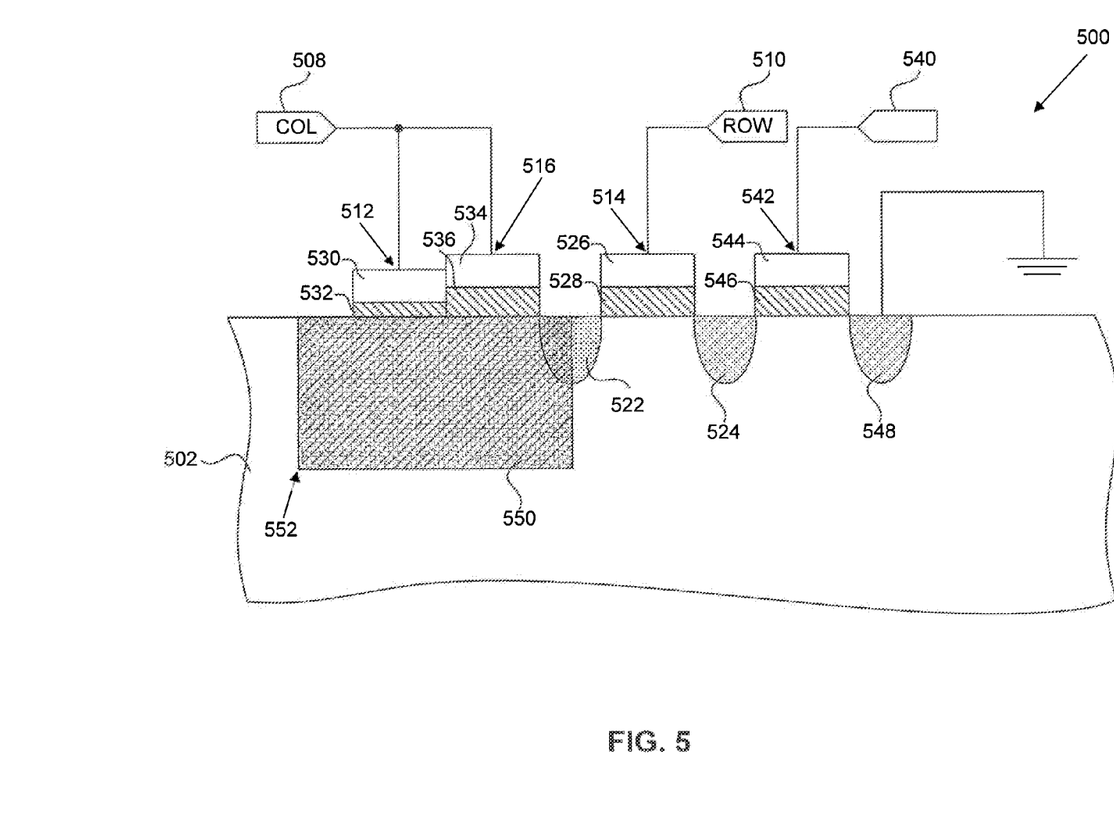
FIG. 5 illustrates an exemplary OTP memory cell cross-section in accordance with an exemplary embodiment of the present disclosure.

FIG. 5 illustrates a cross-sectional view of an exemplary OTP memory cell 500 in an exemplary embodiment of the present disclosure. The OTP memory cell 500 is similar to memory cell 400, and includes a natively-doped region 550.

In addition to the natively-doped region 550, memory cell 500 can include column line 508, programmable thin oxide anti-fuse 512, thick oxide spacer transistor 516, a first thick oxide access transistor 514, a second thick oxide access transistor 542, row line 510, and input 540. These elements correspond respectively to column line 408, programmable thin oxide anti-fuse 412, thick oxide spacer transistor 416, first thick oxide access transistor 414, second thick oxide access transistor 442, row line 410, and input 440 in FIG. 4. Therefore, description of these similar elements has been omitted.

Natively-doped region 550 is a region of the substrate 502 that is covered with a native implant mask, and is therefore not subjected to an implant process generally performed on the substrate 502 (e.g., the natively-doped region 550 is an un-doped region of the substrate 502). In other words, the natively-doped region 550 can be an un-doped region of the substrate 502, while the areas of the substrate 502 not covered with the native implant mask are subjected to an implant process (i.e., these other areas are doped regions). The natively-doped region 550 is located in the area of the substrate 502 beneath where the programmable thin oxide anti-fuse 512 and thick oxide spacer transistor 516 are formed on the substrate 502. That is, the programmable thin oxide anti-fuse 512 and thick oxide spacer transistor 516 are disposed on the natively-doped region 550 of the substrate 502. More specifically, the programmable thin oxide anti-fuse 512 and thick oxide spacer transistor 516 are disposed on the surface of the substrate 502, so as to be within an area "footprint" defined by the natively-doped region 550. As illustrated in FIG. 5, the natively-doped region 550 may extend beyond the areas of the substrate 502 that are directly beneath the programmable thin oxide anti-fuse 512 and thick oxide spacer transistor 516. For example, the natively-doped region 550 can extend to include a portion of the drain 522. In addition to, or alternatively, the natively-doped region 550 can extend to include portions of the substrate 502 beyond a side of the programmable thin oxide anti-fuse 512 opposite the thick oxide spacer transistor 516, as illustrated by edge 552.

The areas of the substrate 502 not included in the natively-doped region 550 may be doped using a standard threshold voltage implant process that will be apparent to those skilled in the relevant art(s) without departing from the spirit and scope of the present disclosure. For example, the areas of the substrate 502 not included in the natively-doped region 550 may be subjected to a doping implant process that results ii a standard threshold voltage characteristic for these areas.

The IV (current-voltage) characteristics of programmed instances of memory cell 500 are beneficially made more uniform by including the natively-doped region 550. In particular, the natively-doped region 550, and the placement thereof, provides for more uniform threshold and reverse-breakdown voltages of the memory cell 500.

Figure 6:
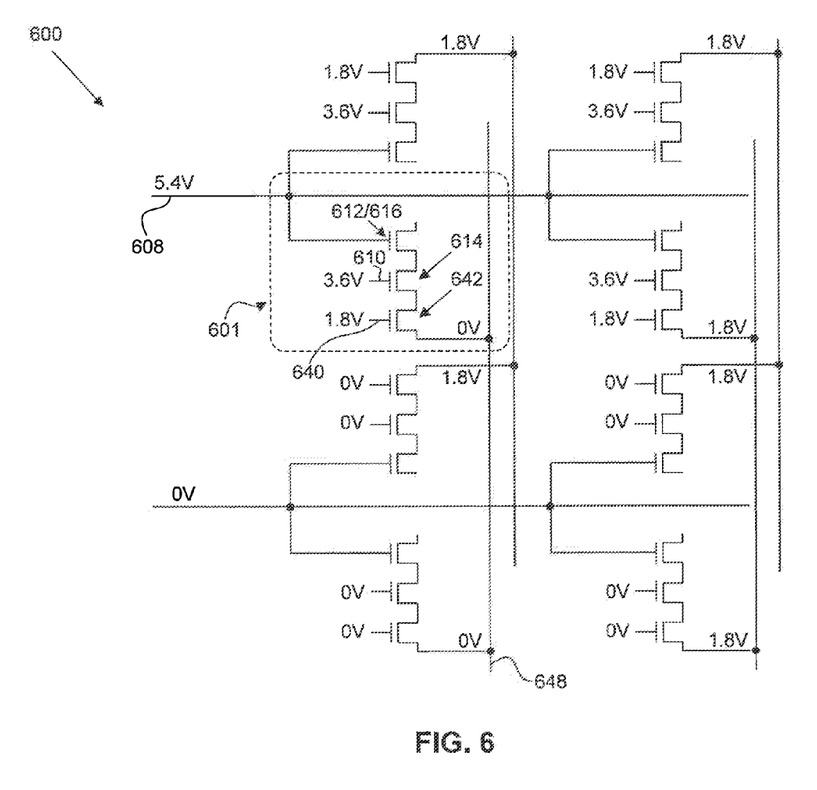
FIG. 6 illustrates an exemplary OTP memory cell circuit in accordance with an exemplary embodiment of the present disclosure.

FIG. 6 illustrates an exemplary OTP memory cell array 600 including an exemplary OTP memory cell 601 that is subjected to a programing process in an exemplary embodiment of the present disclosure. The memory cell 601 is similar to the exemplary memory cells shown in FIGS. 3-5 that include a second thick oxide access transistor (e.g., second thick oxide access transistor 542 of FIG. 5). Note that anti-fuse 612 and spacer transistor 616 are represented as a single component 612/616 in FIG. 6 for ease of illustration.

During a programing operation, the combination of voltages, or lack thereof, applied to the various components of each of the memory cells within the memory cell array determine the currently programmed memory cell. For example, to program the memory cell 601 of the memory cell array, a program voltage (e.g., approximately 5.4V) is applied to the gate of spacer transistor 616 and the anti-fuse 612 through column line 608, a first supply voltage (e.g., approximately 3.6V) is applied to the gate of the first thick oxide access transistor 614 through row line 610, a second supply voltage (approximately 1.8V) is applied to the gate of the second thick oxide access transistor 642 through input 640, and the source 648 of the second thick oxide access transistor 642 is pulled to ground.

Note that the other memory cells of the memory cell array 600 located within the same row as memory cell 601 will also have similar voltages applied to their respective spacer transistor and anti-fuse, as well as similar voltages to their respective first and second thick oxide access transistors. However, these other memory cells within the programming row are not subjected to programming because the sources of their respective second thick oxide access transistors are pulled to the second supply voltage (e.g., 1.8V) rather than to ground.

Similarly, the sources of the second thick oxide access transistors of each of the respective memory cells within the same column as memory cell 601 will also be pulled to ground. However, these other memory cells within the programing column are not subjected to programming because the gates of the spacer transistors, the anti-fuses, the gates of the first thick oxide access transistors, and the gates of the second thick oxide access transistors of each of these respective memory cells are pulled to ground rather than to the program and supply voltages.

Figure 7:
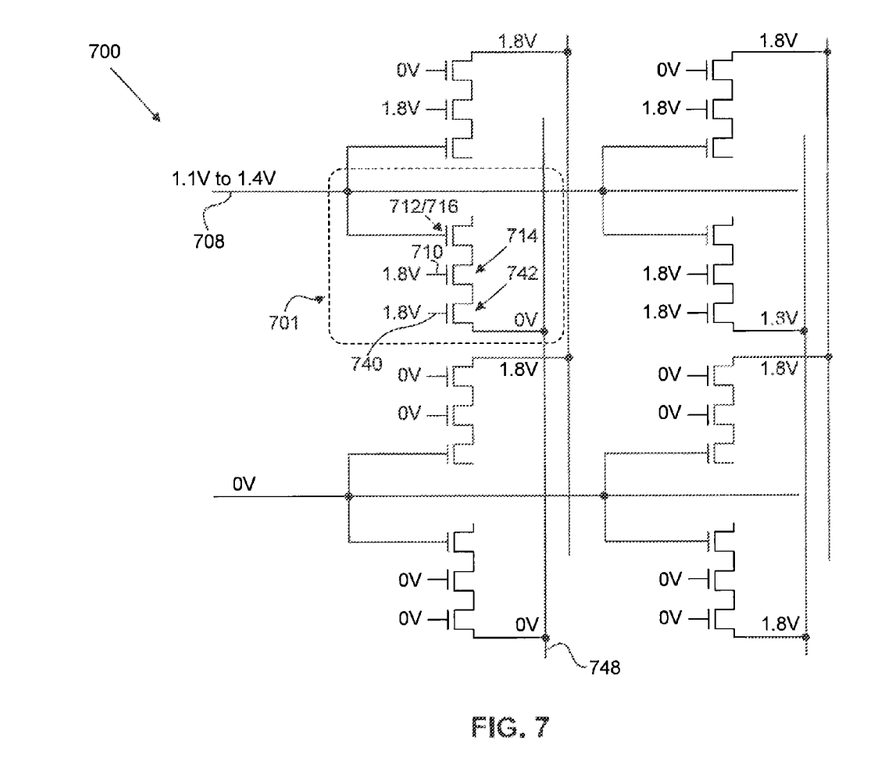
FIG. 7 illustrates an exemplary OTP memory cell circuit in accordance with an exemplary embodiment of the present disclosure.

FIG. 7 illustrates an exemplary OTP memory cell array 700 including an exemplary OTP memory cell 701 that is subjected to a reading operation in an exemplary embodiment of the present disclosure. The memory cell 701 is similar to the exemplary memory cells shown in FIGS. 3-6 that include a second thick oxide access transistor. Note that anti-fuse 712 and spacer transistor 716 are represented as a single component 712/716 in FIG. 7 for ease of illustration.

During a reading operation, the combination of voltages, or lack thereof, applied to the various components of each of the memory cells within the memory cell array determine the currently read memory cell. For example, to read the memory cell 701 of the memory cell array, a reading voltage (e.g., approximately 1.1-1.4V) is applied to the gate of spacer transistor 716 and the anti-fuse 712 through column line 708, the second supply voltage (e.g., approximately 1.8V) is applied to the gate of the first thick oxide access transistor 714 through row line 710 and to the gate of the second thick oxide access transistor 742 through input 740, and the source 748 of the second thick oxide access transistor 742 is pulled to ground.

Note that the other memory cells of the memory cell array 700 located within the same row as memory cell 701 will also have similar voltages applied to their respective spacer transistor and anti-fuse, as well as similar voltages to their respective first and second thick oxide access transistors. However, these other memory cells within the reading row are not read because the sources of their respective second thick oxide access transistors are pulled to the second supply voltage (e.g., 1.8V) rather than to ground.

Similarly, the sources of the second thick oxide access transistors of each of the respective memory cells within the same column as memory cell 700 will also be pulled to ground. However, these other memory cells within the read column are not read because the gates of the spacer transistors, the anti-fuses, the gates of the first thick oxide access transistors, and the gates of the second thick oxide access transistors of each of these respective memory cells are pulled to ground rather than to the reading and supply voltages. Further, as shown in FIG. 7, the memory cells within the reading row but that are not read may also have the second supply voltage applied to the gate of the first thick oxide access transistor while the gate of the second transistor is pulled to ground (e.g., the second access transistor is off).

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

The exemplary embodiments described herein are provided for illustrative purposes, and are not limiting. Other exemplary embodiments are possible, and modifications may be made to the exemplary embodiments within the spirit and scope of the disclosure. Therefore, the specification is not meant to limit the disclosure or the claims. Further, the scope of the invention is defined only in accordance with the following claims and their equivalents.

The forgoing Detailed Description of the exemplary embodiments has revealed the general nature of the present disclosure so that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

CONCLUSION

It is to be appreciated that the Detailed Description section, and not the Abstract section, is intended to be used to interpret the claims. The Abstract section may set forth one or more, but not all exemplary embodiments, and thus, is not intended to limit the disclosure and the appended claims in any way.

It will be apparent to those skilled in the relevant art(s) that various changes in form and detail can be made in the present disclosure, without departing from the spirit and scope of the present disclosure. Thus, the invention should not be limited by any of the above-described exemplary embodiments, but should be defined only in accordance with the following claims and their equivalents.

What is claimed is:

1. A programmable memory cell comprising:
   a substrate including an un-doped region;
   a thick oxide spacer transistor disposed on the substrate within the un-doped region of the substrate;
   a programmable thin oxide anti-fuse disposed on the substrate adjacent to a first side of the thick oxide spacer transistor and within the un-doped region of the substrate; and
   first and second thick oxide access transistors disposed on the substrate, the first thick oxide access transistor being disposed between a second side of the thick oxide spacer transistor and the second thick oxide access transistor.

2. The programmable memory cell of claim 1, wherein the first and second thick oxide transistors are disposed on the substrate outside the un-doped region.

3. The programmable memory cell of claim 2, wherein the first and second thick oxide transistors are disposed on a region of the substrate having been subjected to a standard threshold voltage implant process.

4. The programmable memory cell of claim 1, wherein regions of the substrate other than the un-doped region have been subjected to a standard threshold voltage implant process.

5. The programmable memory cell of claim 1, wherein a drain region of the first thick oxide access transistor serves as a source region of the thick oxide spacer transistor.

6. The programmable memory cell of claim 5, wherein a source region of the first thick oxide access transistor serves as a drain region of the second thick oxide access transistor.

7. The programmable memory cell of claim 5, wherein an edge of the un-doped region is formed in the drain region of the first thick oxide access transistor.

8. The programmable memory cell of claim 1, wherein a gate of the thick oxide spacer transistor and the programmable thin oxide anti-fuse are coupled in parallel to a first input.

9. The programmable memory cell of claim 8, wherein a gate of the first thick oxide access transistor and a gate of the second thick oxide access transistor are connected to second and third inputs, respectively.

10. The programmable memory cell of claim 1, wherein:
    an oxide layer of the programmable thin oxide anti-fuse has a first thickness; and oxide layers of each of the thick oxide spacer transistor, the first thick oxide access transistor, and the second thick oxide access transistor have a second thickness greater than the first thickness.

11. A programmable memory cell comprising:
a programmable thin oxide anti-fuse having first and second terminals, the programmable thin oxide anti-fuse being un-doped;
a thick oxide spacer transistor connected to the first and second terminals of the programmable thin oxide anti-fuse,
a first thick oxide access transistor connected to the thick oxide spacer transistor via a first diffusion region; and
a second thick oxide access transistor connected to the first thick oxide access transistor via a second diffusion region,
wherein the programmable thin oxide anti-fuse and the thick oxide spacer transistor have a different doping concentration than the first and second thick oxide access transistors.

12. The programmable memory cell of claim 11, wherein the thick oxide spacer transistor is un-doped.

13. The programmable memory cell of claim 12, wherein the first and second thick oxide access transistors are doped so as to have standard threshold voltage characteristics.

14. The programmable memory cell of claim 11, wherein the first diffusion region serves as a source region of the thick oxide spacer transistor and a drain region of the first thick oxide spacer transistor.

15. The programmable memory cell of claim 14, wherein the second diffusion region serves as a source region of the first thick oxide access transistor and a drain region of the second thick oxide spacer transistor.

16. The programmable memory cell of claim 15, wherein the programmable memory cell further comprises a third diffusion region that serves as a source region of the second thick oxide access transistor.

17. The programmable memory cell of claim 11, wherein:
an oxide layer of the programmable thin oxide anti-fuse has a first thickness; and
oxide layers of each of the thick oxide spacer transistor, the first thick oxide access transistor, and the second thick oxide access transistor have a second thickness greater than the first thickness.

18. A programmable memory cell comprising:
a programmable thin oxide anti-fuse connected to a thick oxide spacer transistor, the programmable thin oxide anti-fuse including a first oxide layer having a first thickness;
a first thick oxide access transistor connected to the thick oxide spacer transistor; and
a second thick oxide access transistor connected to the first thick oxide access transistor,
wherein the thick oxide spacer transistor, the first thick oxide access transistor, and the second thick oxide access transistor each include a second oxide layer having a second thickness greater than the first thickness,
wherein the programmable thin oxide anti-fuse and the thick oxide spacer transistor are un-doped and the first and the second thick oxide access transistors are doped so as to have standard threshold voltage characteristics.

19. The programmable memory cell of claim 18, wherein the programmable memory cell is programmed utilizing a plurality of voltages, comprising:
a programming voltage that is applied to the programmable thin oxide anti-fuse and the thick oxide spacer transistor;
a first supply voltage that is applied to the first thick oxide access transistor;
a second supply voltage that is applied to the second thick oxide access transistor, the programming voltage being greater than the first supply voltage, and the first supply voltage being greater than the second supply voltage; and
a ground voltage that is applied to a source region of the second thick oxide access transistor.

20. The programmable memory cell of claim 18, wherein the programmable memory cell is read utilizing a plurality of voltages, comprising;
a reading voltage that is applied to the programmable thin oxide anti-fuse and the thick oxide spacer transistor;
a supply voltage that is applied to the first and second thick oxide access transistors, wherein the reading voltage is less than the supply voltage;
a ground voltage that is applied to a source region of the second thick oxide access transistor; and
wherein a voltage potential at the programmable thin oxide anti-fuse is measured and compared to the applied reading voltage.

* * * * *